United States Patent
Lau et al.

(10) Patent No.: US 11,682,612 B2
(45) Date of Patent: Jun. 20, 2023

(54) PACKAGE STRUCTURE AND MANUFACTURING METHOD THEREOF

(71) Applicant: Unimicron Technology Corp., Taoyuan (TW)

(72) Inventors: John Hon-Shing Lau, Taoyuan (TW); Cheng-Ta Ko, Taipei (TW); Pu-Ju Lin, Hsinchu (TW); Kai-Ming Yang, Hsinchu County (TW); Chi-Hai Kuo, Taoyuan (TW); Chia-Yu Peng, Taoyuan (TW); Tzyy-Jang Tseng, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/235,944

(22) Filed: Apr. 21, 2021

(65) Prior Publication Data

US 2022/0344248 A1 Oct. 27, 2022

(51) Int. Cl.
*H01L 23/538* (2006.01)
*H01L 23/498* (2006.01)
(Continued)

(52) U.S. Cl.
CPC ...... *H01L 23/49816* (2013.01); *H01L 21/486* (2013.01); *H01L 21/4857* (2013.01);
(Continued)

(58) Field of Classification Search
CPC .................. H01L 23/5385; H01L 23/5386
See application file for complete search history.

(56) References Cited

U.S. PATENT DOCUMENTS

| 2021/0035913 A1* | 2/2021 | Park .................... H01L 25/50 |
| 2021/0407962 A1* | 12/2021 | Kim .................... H01L 23/5384 |
| 2022/0037248 A1* | 2/2022 | Choi ................... H01L 21/4857 |

FOREIGN PATENT DOCUMENTS

| CN | 112262460 | 1/2021 |
| TW | I446842 | 7/2014 |

(Continued)

OTHER PUBLICATIONS

"Office Action of Taiwan Counterpart Application", dated Sep. 27, 2021, p. 1-p. 6.

*Primary Examiner* — Michele Fan
(74) *Attorney, Agent, or Firm* — JCIPRNET

(57) ABSTRACT

A package structure includes a redistribution layer, a chip assembly, a plurality of solder balls, and a molding compound. The redistribution layer includes redistribution circuits, photoimageable dielectric layers, conductive through holes, and chip pads. One of the photoimageable dielectric layers located on opposite two outermost sides has an upper surface and openings. The chip pads are located on the upper surface and are electrically connected to the redistribution circuits through the conductive through holes. The openings expose portions of the redistribution circuits to define solder ball pads. Line widths and line spacings of the redistribution circuits decrease in a direction from the solder ball pads towards the chip pads. The chip assembly is disposed on the chip pads and includes at least two chips with different sizes. The solder balls are disposed on the solder ball pads, and the molding compound at least covers the chip assembly.

8 Claims, 20 Drawing Sheets

(51) Int. Cl.
    *H01L 23/00*     (2006.01)
    *H01L 23/31*     (2006.01)
    *H01L 21/48*     (2006.01)
    *H01L 21/56*     (2006.01)
    *H01L 25/065*    (2023.01)

(52) U.S. Cl.
    CPC ........ *H01L 21/565* (2013.01); *H01L 23/3135* (2013.01); *H01L 23/49822* (2013.01); *H01L 23/49833* (2013.01); *H01L 23/49838* (2013.01); *H01L 23/5385* (2013.01); *H01L 23/5386* (2013.01); *H01L 24/13* (2013.01); *H01L 24/16* (2013.01); *H01L 24/73* (2013.01); *H01L 25/0655* (2013.01); *H01L 2224/13147* (2013.01); *H01L 2224/13582* (2013.01); *H01L 2224/16227* (2013.01); *H01L 2224/16235* (2013.01); *H01L 2224/73204* (2013.01); *H01L 2924/1434* (2013.01); *H01L 2924/14335* (2013.01); *H01L 2924/35* (2013.01)

(56) References Cited

FOREIGN PATENT DOCUMENTS

| | | |
|---|---|---|
| TW | 201841269 | 11/2018 |
| TW | 201911494 | 3/2019 |
| TW | 202021161 | 6/2020 |

\* cited by examiner

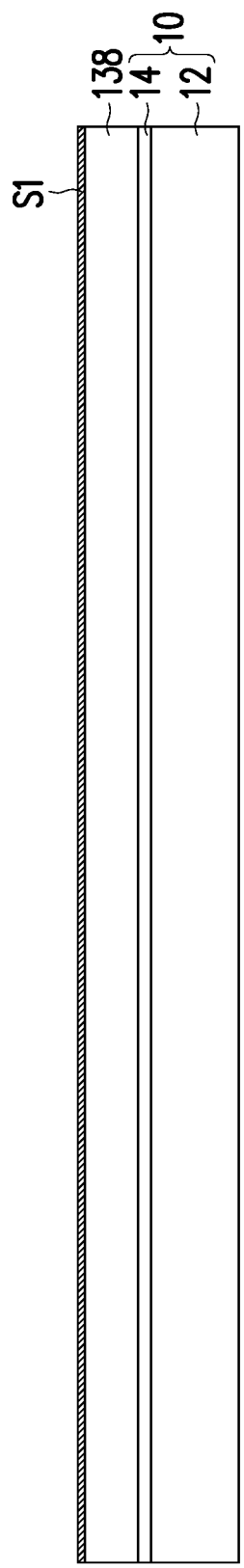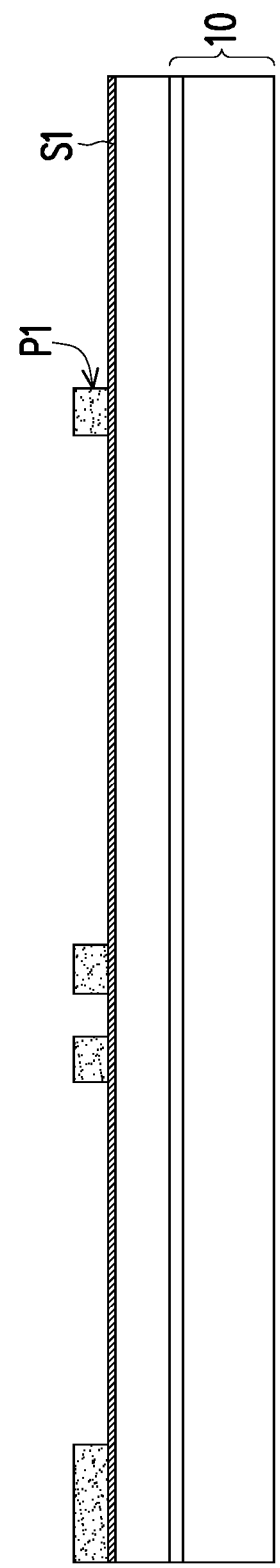
FIG. 2A
FIG. 2B

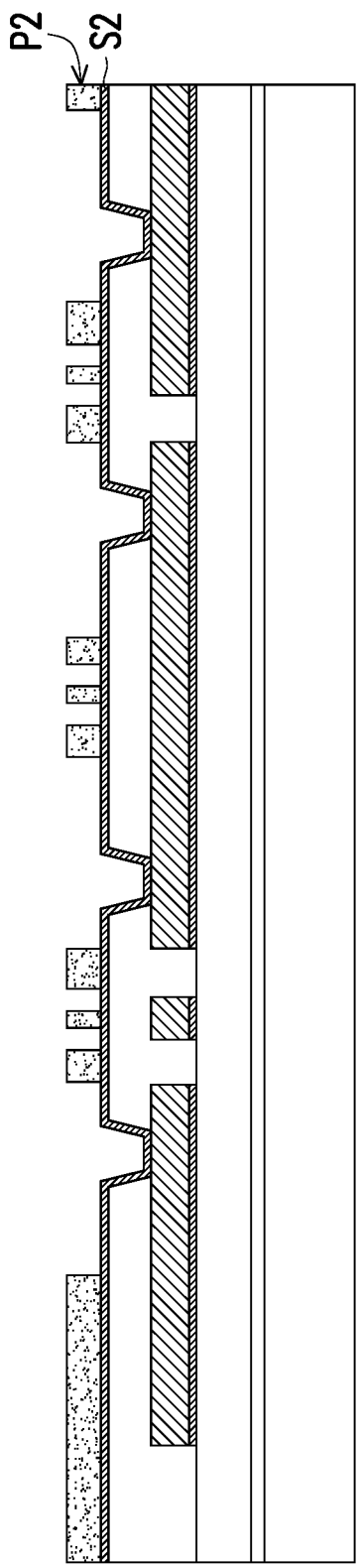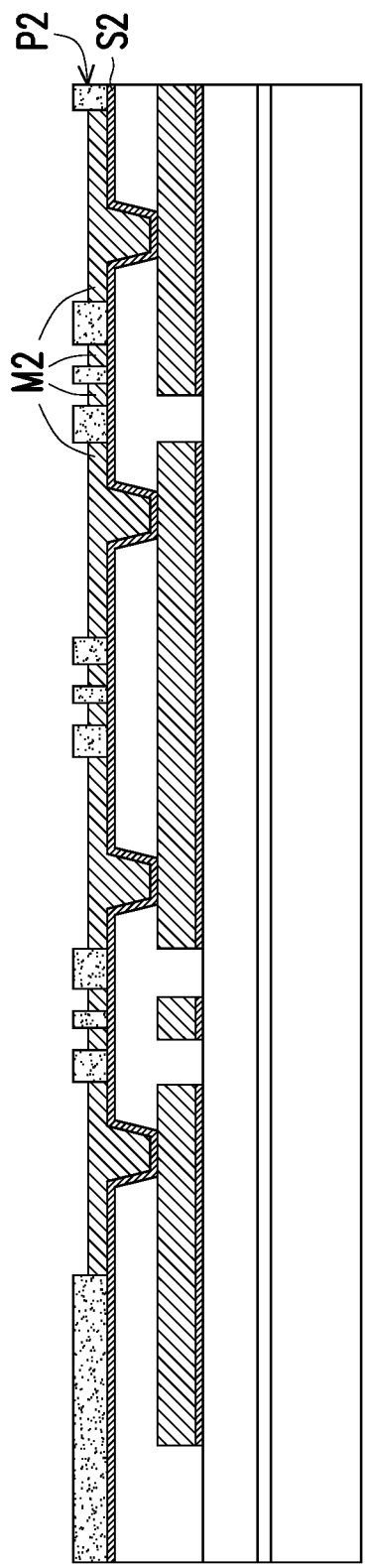

PACKAGE STRUCTURE AND MANUFACTURING METHOD THEREOF

BACKGROUND

Technical Field

The disclosure relates to a semiconductor structure and a manufacturing method thereof, and in particular, to a package structure and a manufacturing method thereof.

Description of Related Art

In the related art, when the fan out panel level package (FOPLP) of the chip-last (or the RDL first) is manufactured, the fine lines of the redistribution circuit substrate are manufactured on a temporary substrate first. Next, after the general circuit of the redistribution circuit substrate is manufactured, the redistribution circuit substrate is required to be transferred from the original temporary substrate to another temporary substrate. Further, before the chip and the redistribution circuit substrate are bonded, the original temporary substrate is debonded to expose the chip pad to be electrically connected to the chip. Nevertheless, in the transferring process, the redistribution circuit substrate is prone to generate uneven expansion and contraction, and structural reliability of products is thereby affected subsequently.

SUMMARY

The disclosure provides a package structure exhibiting good structural reliability.

The disclosure further provides a manufacturing method of a package structure configured to manufacture the above-mentioned package structure.

A package structure provided by the disclosure includes a redistribution layer, a chip assembly, a plurality of solder balls, and a molding compound. The redistribution layer includes a plurality of redistribution circuits, a plurality of photoimageable dielectric layers, a plurality of conductive through holes, and a plurality of chip pads. The redistribution circuits and the photoimageable dielectric layers are disposed in an alternating manner, and the conductive through holes penetrate through the photoimageable dielectric layers and are electrically connected to the redistribution circuits. One of the photoimageable dielectric layers located on opposite two outermost sides has an upper surface. The chip pads are located on the upper surface and are electrically connected to the redistribution circuits through the conductive through holes. The other one of the photoimageable dielectric layers located on the opposite two outermost sides has a plurality of openings. The openings expose portions of the redistribution circuits to define a plurality of solder ball pads. Line widths and line spacings of the redistribution circuits decrease in a direction from the solder ball pads towards the chip pads. The chip assembly is disposed on the chip pads and is electrically connected to the chip pads. The chip assembly includes at least two chips with different sizes. The solder balls are disposed on the solder ball pads and are electrically connected to the solder ball pads. The molding compound at least covers the chip assembly.

In an embodiment of the disclosure, the redistribution layer includes a first redistribution layer, a second redistribution layer, and a third redistribution layer. The redistribution circuits include a first redistribution circuit, a second redistribution circuit, and a third redistribution circuit. The photoimageable dielectric layers include a first photoimageable dielectric layer, a second photoimageable dielectric layer, a third photoimageable dielectric layer, and a fourth photoimageable dielectric layer. The conductive through holes include a plurality of first conductive through holes, a plurality of second conductive through holes, and a plurality of third conductive through holes. The first redistribution layer includes the chip pads, the first redistribution circuit, the first photoimageable dielectric layer, and the first conductive through holes penetrating through the first photoimageable dielectric layer. The first photoimageable dielectric layer has the upper surface, and the chip pads are electrically connected to the first redistribution circuit through the first conductive through holes. The second redistribution layer includes the second redistribution circuit, the second photoimageable dielectric layer, and the second conductive through holes penetrating through the second photoimageable dielectric layer. The second conductive through holes are electrically connected to the first redistribution circuit and the second redistribution circuit. The third redistribution layer includes the third redistribution circuit, the third photoimageable dielectric layer, the fourth photoimageable dielectric layer, and the third conductive through holes penetrating through the third photoimageable dielectric layer. The third conductive through holes are electrically connected to the second redistribution circuit and the third redistribution circuit. The fourth photoimageable dielectric layer covers the third photoimageable dielectric layer and the third redistribution circuit and has the openings. The openings expose portions of the third redistribution circuit to define the solder ball pads. A line width and a line spacing of the third redistribution circuit are greater than a line width and a line spacing of the second redistribution circuit. The line width and the line spacing of the second redistribution circuit are greater than a line width and a line spacing of the first redistribution circuit.

In an embodiment of the disclosure, the line width and the line spacing of the first redistribution circuit are both 2 microns. The line width and the line spacing of the second redistribution circuit are both 5 microns. The line width and the line spacing of the third redistribution circuit are both 10 microns.

In an embodiment of the disclosure, a thickness of the first redistribution circuit is equal to a thickness of the second redistribution circuit, and the thickness of the second redistribution circuit is less than a thickness of the third redistribution circuit.

In an embodiment of the disclosure, a depth of each of the second conductive through holes is equal to a depth of each of the third conductive through holes, and a depth of each of the first conductive through holes is less than the depth of each of the second conductive through holes.

In an embodiment of the disclosure, a periphery of the molding compound is aligned with a periphery of the first redistribution layer, a periphery of the second redistribution layer, and a periphery of the third redistribution layer.

In an embodiment of the disclosure, the package structure further includes a plurality of copper pillars and a plurality of solder materials. The copper pillars are disposed on the chip assembly and are located between the chip assembly and the chip pads. The solder materials are disposed on the copper pillars and are located between the copper pillars and the chip pads.

In an embodiment of the disclosure, the package structure further includes an underfill disposed between the molding compound and the redistribution layer. The underfill covers the copper pillars, the solder materials, and the chip pads, and a periphery of the underfill is aligned with a periphery of the molding compound.

In an embodiment of the disclosure, the chip assembly includes a processor and two memories, and a size of the processor is greater than a size of each of the memories.

In an embodiment of the disclosure, the package structure further includes a circuit board disposed below the redistribution layer, and the chip assembly is electrically connected to the circuit board through the solder balls.

A manufacturing method of a package structure provided by the disclosure includes the following steps. A redistribution layer is formed on a temporary carrier panel. The redistribution layer includes a plurality of redistribution circuits, a plurality of photoimageable dielectric layers, a plurality of conductive through holes, and a plurality of chip pads. The redistribution circuits and the photoimageable dielectric layers are disposed in an alternating manner. The conductive through holes penetrate through the photoimageable dielectric layers and are electrically connected to the redistribution circuits. One of the photoimageable dielectric layers located on opposite two outermost sides has an upper surface, and the chip pads are located on the upper surface and are electrically connected to the redistribution circuits through the conductive through holes. The other one of the photoimageable dielectric layers located on the opposite two outermost sides is directly attached on the temporary carrier panel. A chip assembly is arranged on the chip pads to be electrically connected to the chip pads, and the chip assembly includes at least two chips with different sizes. A molding compound is formed to at least cover the chip assembly. The temporary carrier panel is removed after the chip assembly is arranged on the chip pads to expose the other one of the photoimageable dielectric layers located on the opposite two outermost sides. A plurality of openings are formed on the other one of the photoimageable dielectric layers located on the opposite two outermost sides to expose portions of the redistribution circuits to define a plurality of solder ball pads. Line widths and line spacings of the redistribution circuits decrease in a direction from the solder ball pads towards the chip pads. A plurality of solder balls are formed on the solder ball pads to be electrically connected to the solder ball pads.

In an embodiment of the disclosure, the redistribution layer includes a first redistribution layer, a second redistribution layer, and a third redistribution layer. The redistribution circuits include a first redistribution circuit, a second redistribution circuit, and a third redistribution circuit. The photoimageable dielectric layers include a first photoimageable dielectric layer, a second photoimageable dielectric layer, a third photoimageable dielectric layer, and a fourth photoimageable dielectric layer. The conductive through holes include a plurality of first conductive through holes, a plurality of second conductive through holes, and a plurality of third conductive through holes. The step of forming the redistribution layer on the temporary carrier panel further includes the following steps. The temporary carrier panel is provided, and the temporary carrier panel includes a substrate and a release film located on the substrate. The third redistribution layer is formed on the temporary carrier panel. The third redistribution layer includes the third redistribution circuit, the third photoimageable dielectric layer, the fourth photoimageable dielectric layer, and the third conductive through holes penetrating through the third photoimageable dielectric layer. The fourth photoimageable dielectric layer covers the third photoimageable dielectric layer and the third redistribution circuit. The second redistribution layer is formed on the third redistribution layer 130. The second redistribution layer includes the second redistribution circuit, the second photoimageable dielectric layer, and the second conductive through holes penetrating through the second photoimageable dielectric layer. The second redistribution circuit and the third conductive through holes are formed at the same time. The third conductive through holes are electrically connected to the second redistribution circuit and the third redistribution circuit. The first redistribution layer is formed on the second redistribution layer. The first redistribution layer includes the chip pads, the first redistribution circuit, the first photoimageable dielectric layer, and the first conductive through holes penetrating through the first photoimageable dielectric layer. The first photoimageable dielectric layer has the upper surface, and the chip pads are electrically connected to the first redistribution circuit through the first conductive through holes. The first redistribution circuit and the second conductive through holes are formed at the same time. The second conductive through holes are electrically connected to the first redistribution circuit and the second redistribution circuit. The chip pads and the first conductive through holes are formed at the same time. A line width and a line spacing of the third redistribution circuit are greater than a line width and a line spacing of the second redistribution circuit. The line width and the line spacing of the second redistribution circuit are greater than a line width and a line spacing of the first redistribution circuit.

In an embodiment of the disclosure, the line width and the line spacing of the first redistribution circuit are both 2 microns. The line width and the line spacing of the second redistribution circuit are both 5 microns. The line width and the line spacing of the third redistribution circuit are both 10 microns.

In an embodiment of the disclosure, a thickness of the first redistribution circuit is equal to a thickness of the second redistribution circuit, and the thickness of the second redistribution circuit is less than a thickness of the third redistribution circuit.

In an embodiment of the disclosure, a depth of each of the second conductive through holes is equal to a depth of each of the third conductive through holes, and a depth of each of the first conductive through holes is less than the depth of each of the second conductive through holes.

In an embodiment of the disclosure, the step of forming the openings further includes the following step. A drilling process is performed on the fourth photoimageable dielectric layer to form the openings exposing portions of the third redistribution circuit.

In an embodiment of the disclosure, the step before arranging the chip assembly on the chip pads further includes the following steps. A plurality of copper pillars are formed on at least two chips of a wafer, and a plurality of solder materials are formed on the copper pillars. The copper pillars are located between the at least two chips and the solder materials.

In an embodiment of the disclosure, the step before forming the molding compound to at least cover the chip assembly further includes the following step. An underfill is formed on the redistribution layer to cover the copper pillars, the solder materials, and the chip pads.

In an embodiment of the disclosure, the chip assembly includes a processor and two memories, and a size of the processor is greater than a size of each of the memories.

In an embodiment of the disclosure, the manufacturing method of the package structure further includes the following step. A circuit board is provided below the redistribution layer, and the chip assembly is electrically connected to the circuit board through the solder balls.

To sum up, in the package structure and the manufacturing method thereof, the redistribution layer is formed on the temporary carrier panel, and such temporary carrier panel is removed after the chip assembly is disposed on the chip pads. In other words, the redistribution circuit which subsequently forms the solder ball pads is manufactured first, and the redistribution circuit which forms the chip pads is then manufactured. Therefore, in the disclosure, transferring is not required to be performed, so that the package structure may exhibit good structural reliability.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
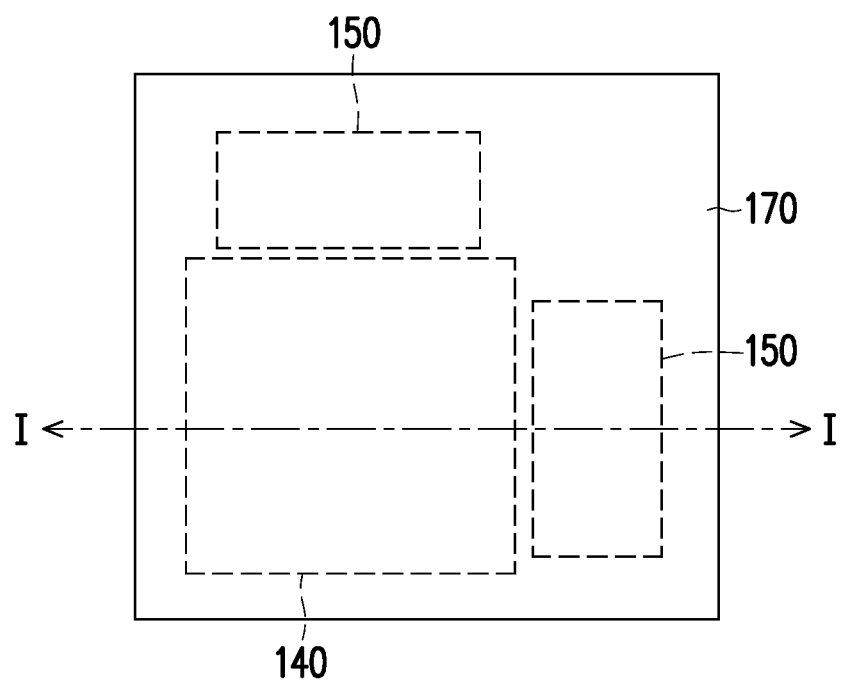
FIG. 1 is top schematic view of a package structure according to an embodiment of the disclosure.

FIG. 1 is top schematic view of a package structure according to an embodiment of the disclosure. FIG. 2A to FIG. 2Z are cross-sectional schematic views of a manufacturing method of the package structure according to an embodiment of the disclosure. Note that FIG. 2A to FIG. 2Z are cross-sectional schematic views taken along a line I-I in FIG. 1. In the manufacturing method of the package structure provided by the present embodiment, first, with reference to FIG. 2S, a redistribution layer RDL is formed on a temporary carrier panel 10. The redistribution layer RDL includes a first redistribution layer 110, a second redistribution layer 120, and a third redistribution layer 130.

To be specific, with reference to FIG. 2A, the temporary carrier panel 10 is provided, and the temporary carrier panel 10 includes a substrate 12 and a release film 14 located on the substrate 12. The substrate 12 is, but not limited to, a glass substrate, for example. Next, a fourth photoimageable dielectric layer 138 and a first seed layer S1 disposed thereon are formed on the release film 14 of the temporary carrier panel 10.

Next, with reference to FIG. 2B, a first patterned photoresist layer P1 is formed on the first seed layer S1, and the first patterned photoresist layer P1 exposes portions of the first seed layer S1.

Figure 2C:
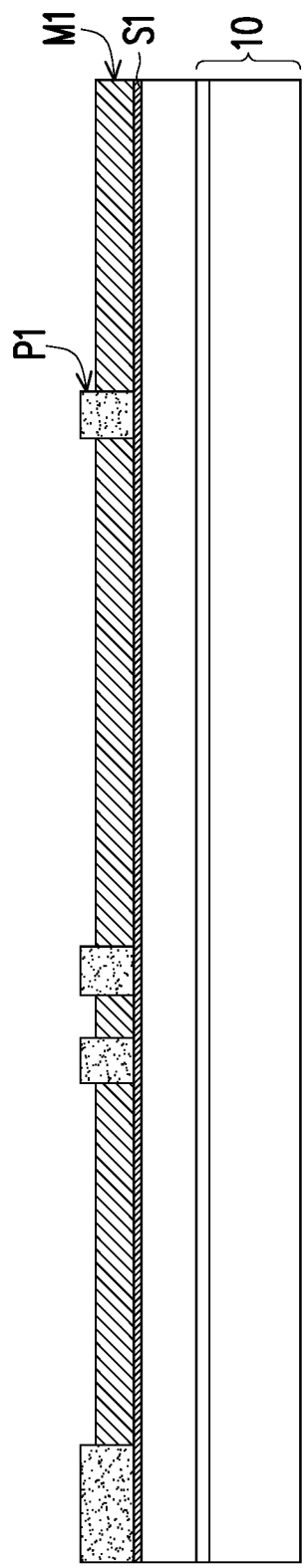
FIG. 2A to FIG. 2Z are cross-sectional schematic views of a manufacturing method of the package structure according to an embodiment of the disclosure.

Next, with reference to FIG. 2C, the first patterned photoresist layer P1 acts as an electroplating mask to electroplate a first metal layer M1 on the first seed layer S1 without the first patterned photoresist layer P1.

Figure 2D:
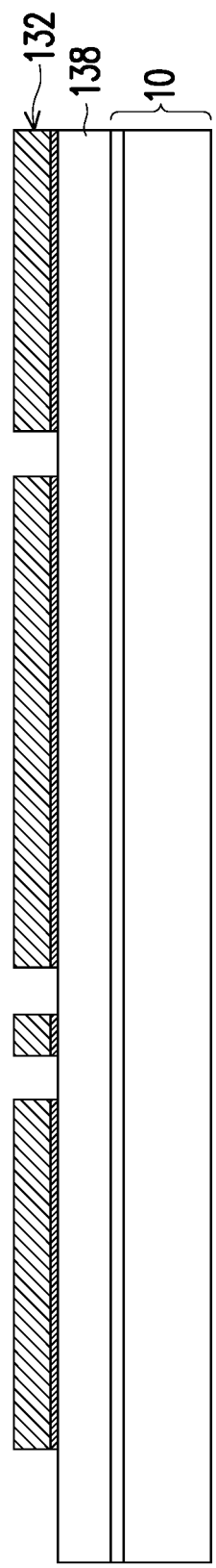

Next, with reference to FIG. 2C and FIG. 2D together, the first patterned photoresist layer P1 and the underlying first seed layer S1 are removed to expose portions of the fourth photoimageable dielectric layer 138 and to form a third redistribution circuit 132.

Figure 2E:
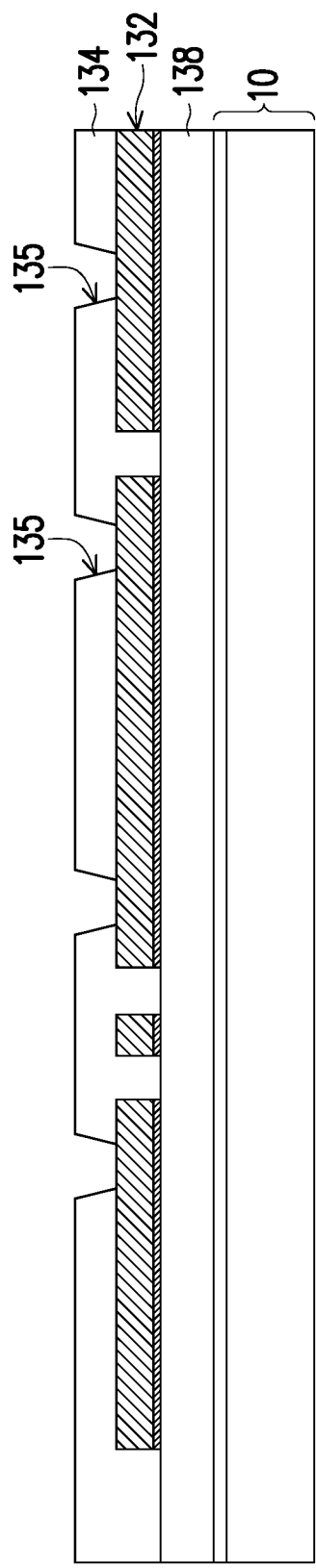

Next, with reference to FIG. 2E, a third photoimageable dielectric layer 134 is formed on the third redistribution circuit 132 and the exposed fourth photoimageable dielectric layer 138. Herein, the third photoimageable dielectric layer 134 has a plurality of openings 135, and the openings 135 expose portions of the third redistribution circuit 132.

Figure 2F:
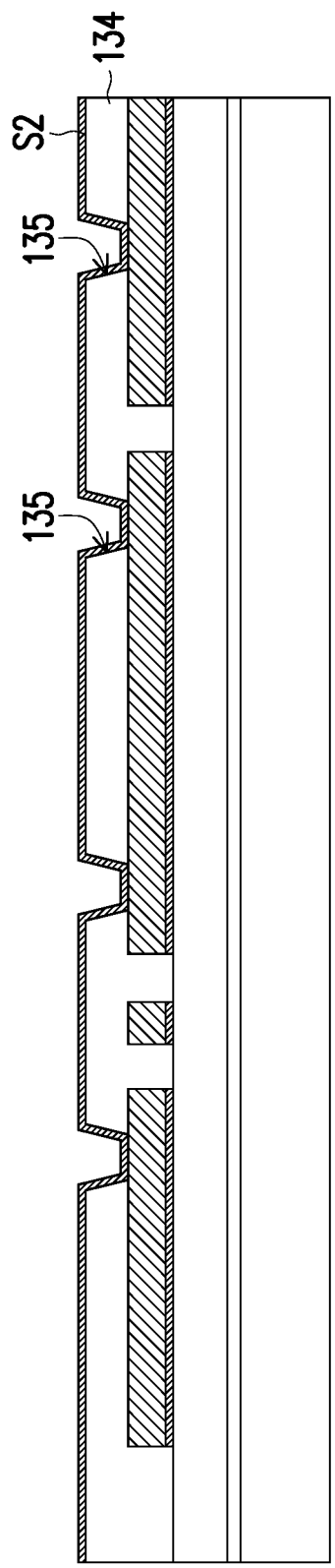

Next, with reference to FIG. 2F, a second seed layer S2 is formed on the third photoimageable dielectric layer 134, and the second seed layer S2 covers the third photoimageable dielectric layer 134 and inner walls of the openings 135.

Next, with reference to FIG. 2G, a second patterned photoresist layer P2 is formed on the second seed layer S2, and the second patterned photoresist layer P2 exposes portions of the second seed layer S2.

Next, with reference to FIG. 2H, the second patterned photoresist layer P2 acts as an electroplating mask to electroplate a second metal layer M2 on the second seed layer S2 without the second patterned photoresist layer P2.

Figure 2I:
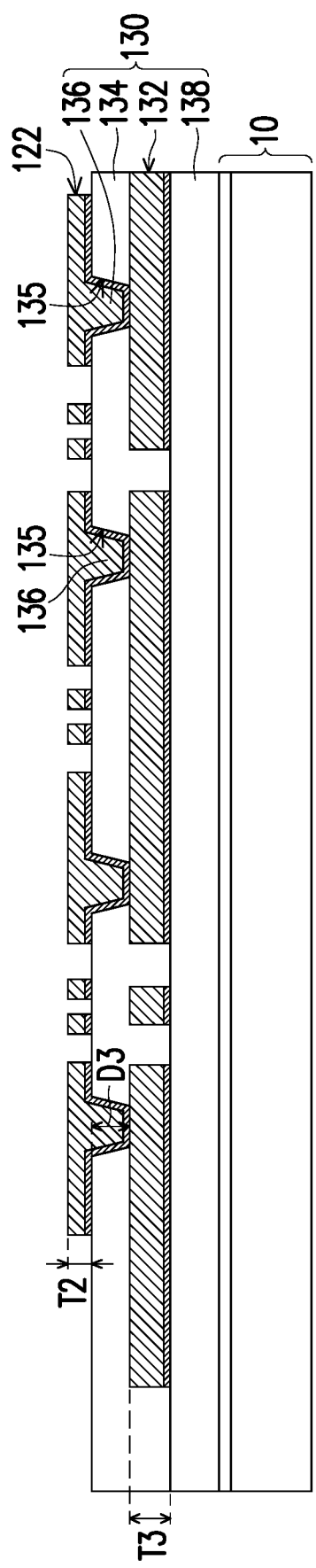

Next, with reference to FIG. 2H and FIG. 2I together, the second patterned photoresist layer P2 and the underlying second seed layer S2 are removed to expose portions of the third photoimageable dielectric layer 134 and to form a plurality of third conductive through holes 136 located in the openings 135 and a second redistribution circuit 122 located on the third photoimageable dielectric layer 134. Herein, the third conductive through holes 136 and the second redistribution circuit 122 are formed at the same time, and the third conductive through holes 136 are electrically connected to the third redistribution circuit 132 and the second redistribution circuit 122. The third redistribution layer 130 is formed on the temporary carrier panel 10 so far. The third redistribution layer 130 includes the third redistribution circuit 132, the third photoimageable dielectric layer 134, the third conductive through holes 136 penetrating through the third photoimageable dielectric layer 134, and the fourth photoimageable dielectric layer 138 covering the third photoimageable dielectric layer 134 and the third redistribution circuit 132.

In particular, in this embodiment, a line width and a line spacing of the third redistribution circuit 132 are greater than a line width and a line spacing of the second redistribution circuit 122. Preferably, the line width and the line spacing of the second redistribution circuit 122 are both, for example, 5 microns, and the line width and the line spacing of the third redistribution circuit 132 are both, for example, 10 microns. Further, a thickness T2 of the second redistribution circuit 122 is less than a thickness T3 of the third redistribution circuit 132. The thickness T2 of the second redistribution circuit 122 is, for example, 2.5 microns, and the thickness T3 of the third redistribution circuit 132 is, for example, 8 microns. In addition, a depth D3 of each of the third conductive through holes 136 is, for example, 6.5 microns.

Figure 2J:
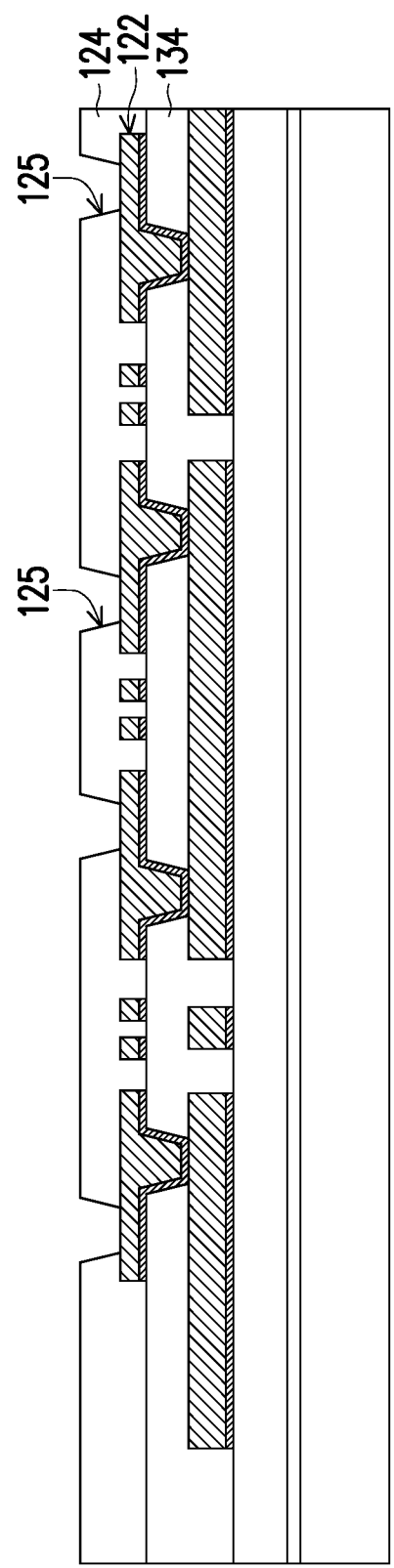

Next, with reference to FIG. 2J, a second photoimageable dielectric layer 124 is formed on the second redistribution circuit 122 and the exposed third photoimageable dielectric layer 134. Herein, the second photoimageable dielectric layer 124 has a plurality of openings 125, and the openings 125 expose portions of the second redistribution circuit 122.

Figure 2K:
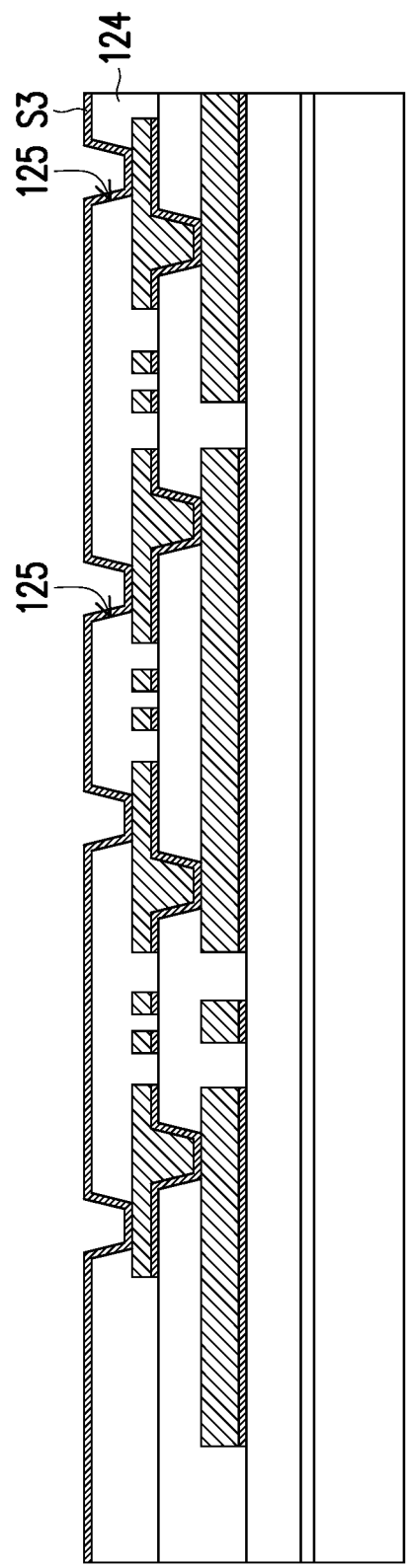

Next, with reference to FIG. 2K, a third seed layer S3 is formed on the second photoimageable dielectric layer 124, and the third seed layer S3 covers the second photoimageable dielectric layer 124 and inner walls of the openings 125.

Figure 2L:
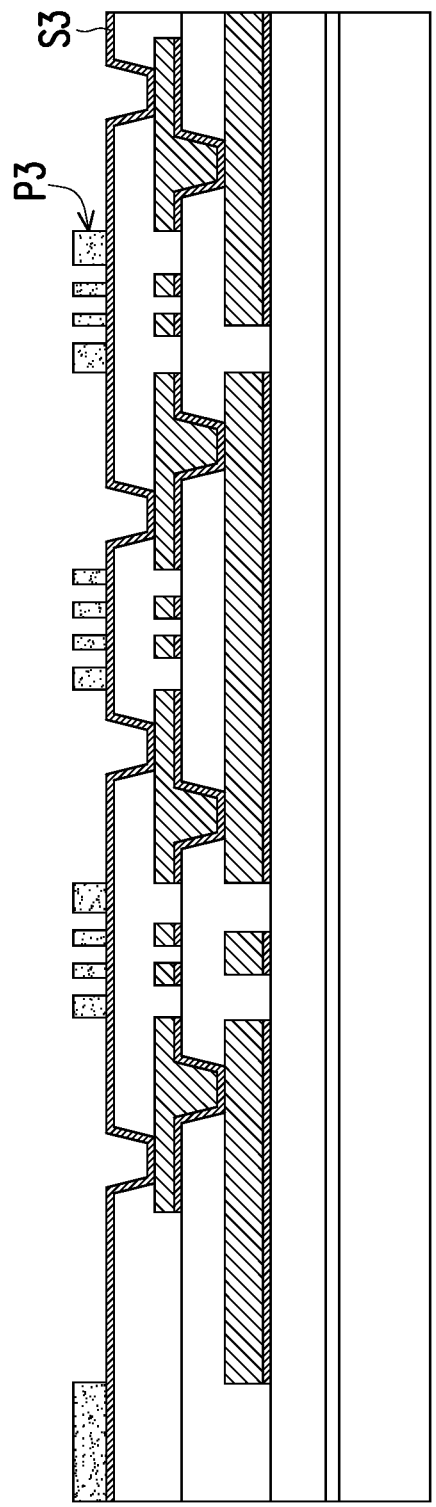

Next, with reference to FIG. 2L, a third patterned photoresist layer P3 is formed on the third seed layer S3, and the third patterned photoresist layer P3 exposes portions of the third seed layer S3.

Figure 2M:
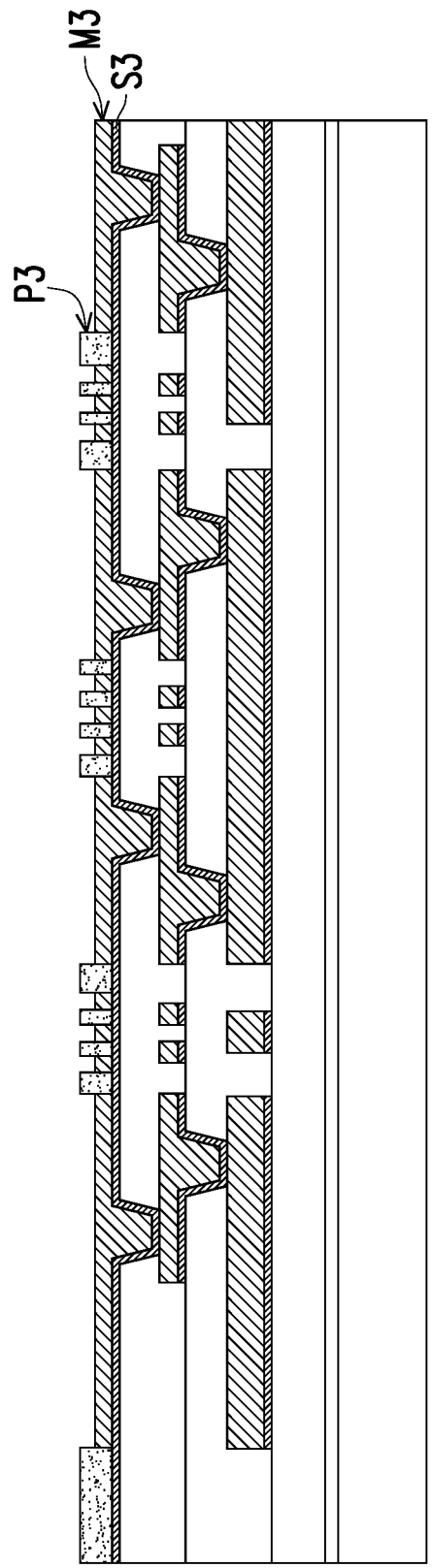

Next, with reference to FIG. 2M, the third patterned photoresist layer P3 acts as an electroplating mask, and a third metal layer M3 is electroplated on the third seed layer S3 without the third patterned photoresist layer P3.

Figure 2N:
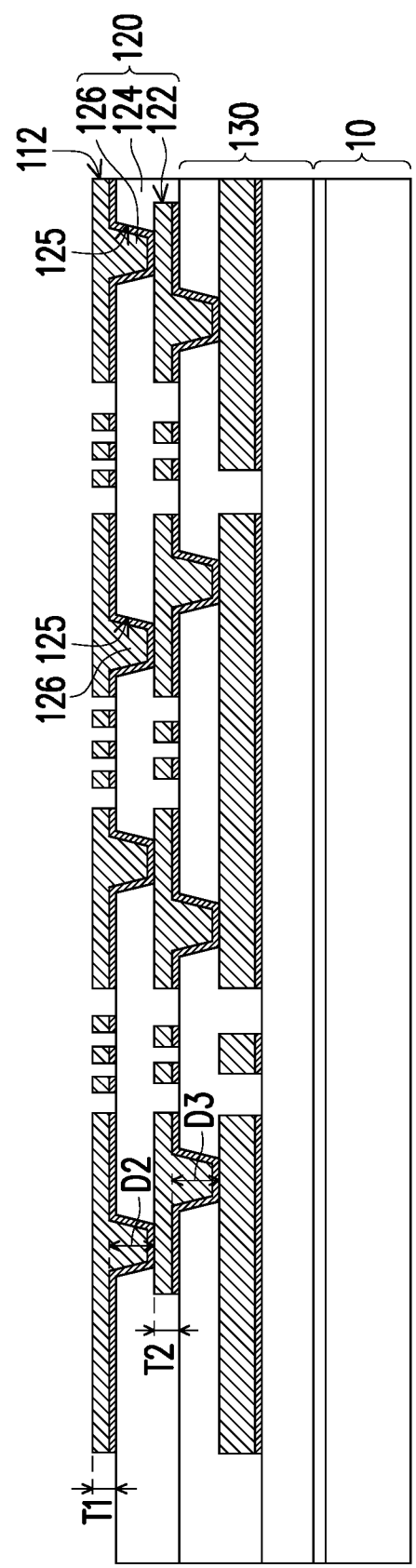

Next, with reference to FIG. 2M and FIG. 2N together, the third patterned photoresist layer P3 and the underlying third seed layer S3 are removed to expose portions of the second photoimageable dielectric layer 124 and to form a plurality of second conductive through holes 126 located in the openings 125 and a second redistribution circuit 112 located on the second photoimageable dielectric layer 124. Herein, the second conductive through holes 126 and the first redistribution circuit 112 are formed at the same time, and the second conductive through holes 126 are electrically connected to the second redistribution circuit 122 and the first redistribution circuit 112. The second redistribution layer 120 is formed on the third redistribution layer 130 so far. The second redistribution layer 120 includes the second redistribution circuit 122, the second photoimageable dielectric layer 124, and the second conductive through holes 126 penetrating through the second photoimageable dielectric layer 124.

In particular, the line width and the line spacing of the second redistribution circuit 122 are greater than a line width and a line spacing of the first redistribution circuit 112. Preferably, the line width and the line spacing of the first redistribution circuit 112 are both, for example, 2 microns. Further, a thickness T1 of the first redistribution circuit 112 is equal to the thickness T2 of the second redistribution circuit 122, that is, the thickness T1 of the first redistribution circuit 112 is 2.5 microns. In addition, a depth D2 of each of the second conductive through holes 126 is equal to the depth D3 of each of the third conductive through holes 136, that is, the depth D2 of each of the second conductive through holes 126 is, for example, 6.5 microns.

Figure 2O:
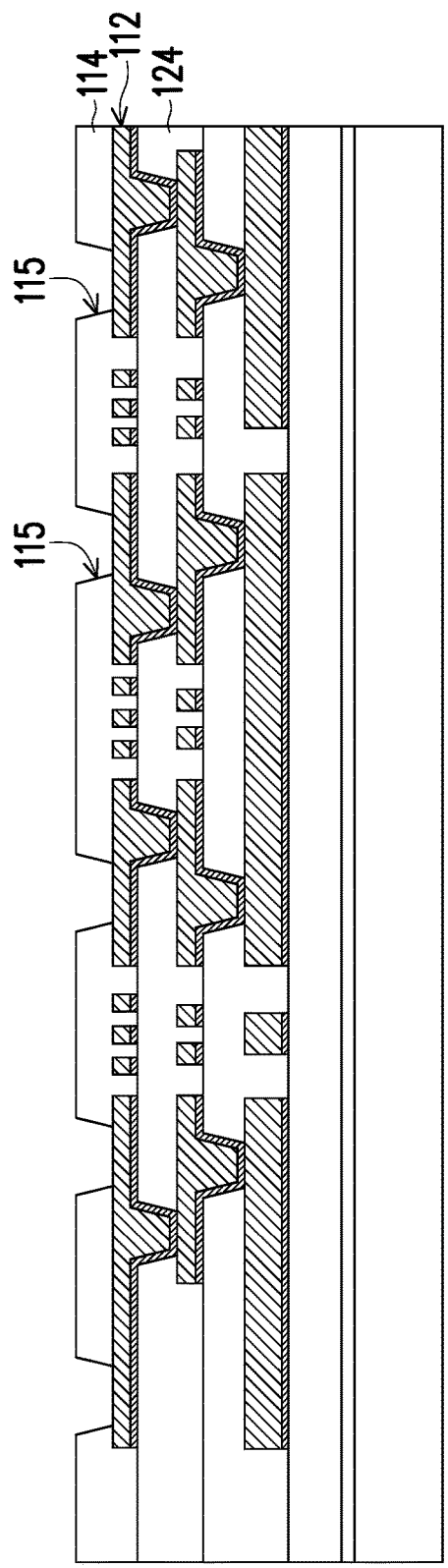

Next, with reference to FIG. 2O, a first photoimageable dielectric layer 114 is formed on the first redistribution circuit 112 and the exposed second photoimageable dielectric layer 124. Herein, the first photoimageable dielectric layer 114 has a plurality of openings 115, and the openings 115 expose portions of the first redistribution circuit 112.

Figure 2P:
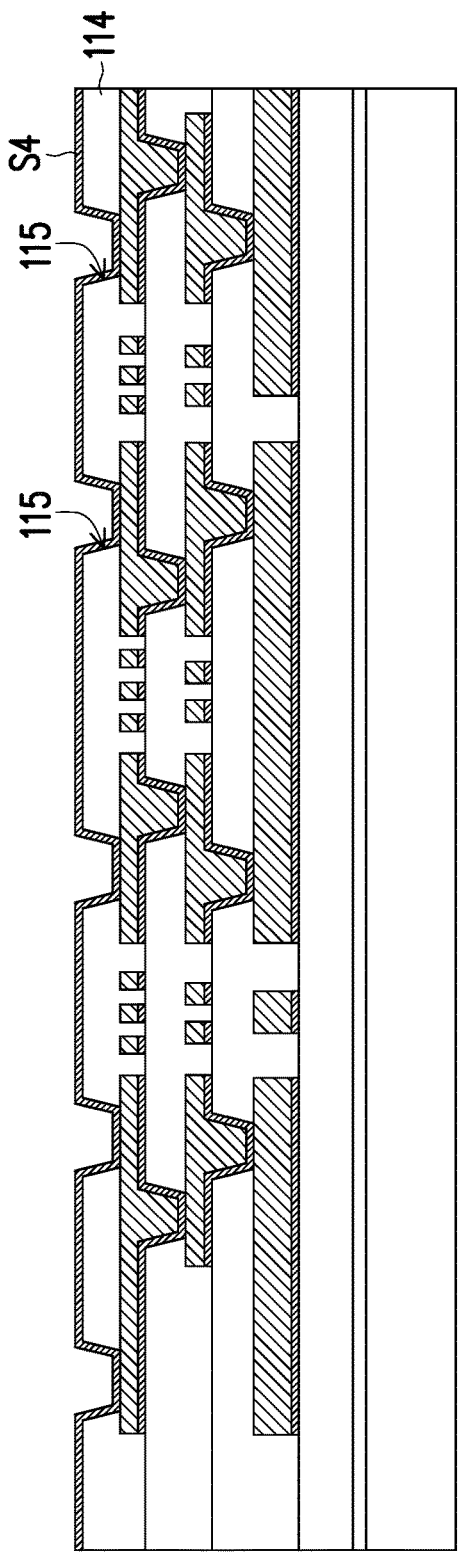

Next, with reference to FIG. 2P, a fourth seed layer S4 is formed on the first photoimageable dielectric layer 114, and the fourth seed layer S4 covers the first photoimageable dielectric layer 114 and inner walls of the openings 115.

Figure 2Q:
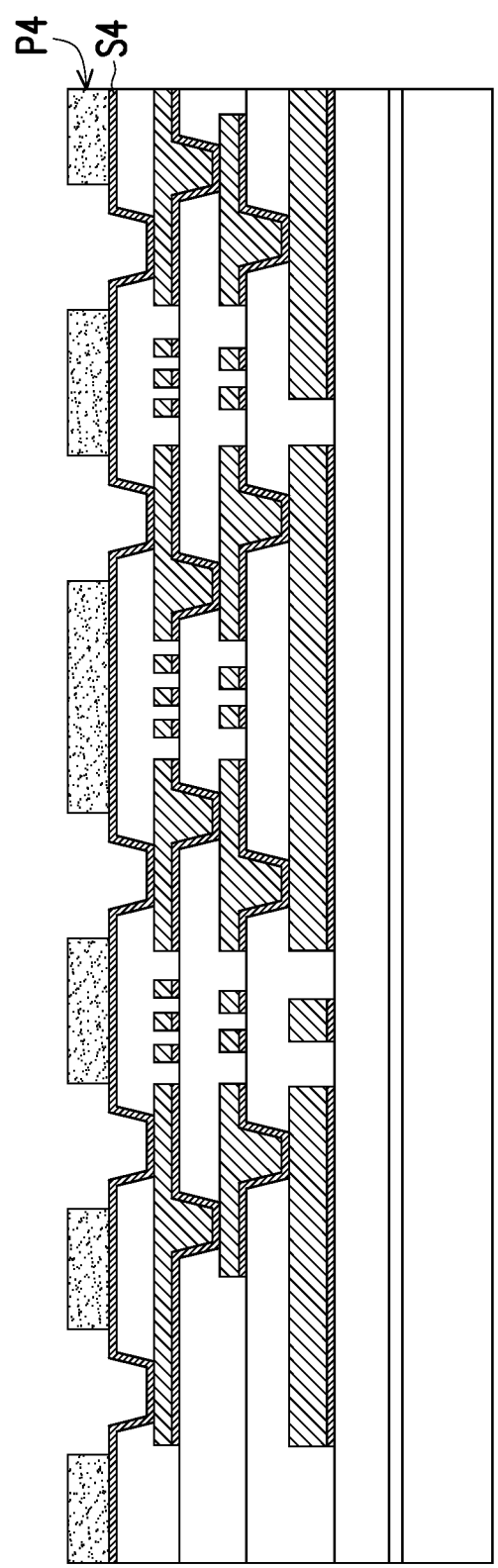

Next, with reference to FIG. 2Q, a fourth patterned photoresist layer P4 is formed on the fourth seed layer S4, and the fourth patterned photoresist layer P4 exposes portions of the fourth seed layer S4.

Figure 2R:
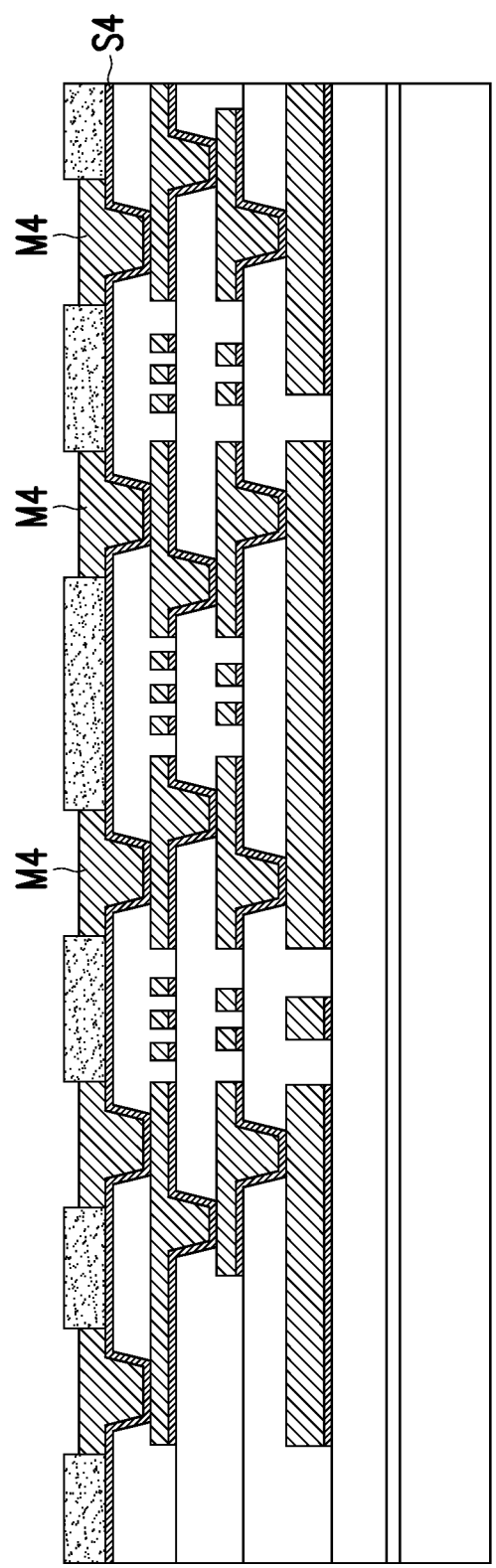

Next, with reference to FIG. 2R, the fourth patterned photoresist layer P4 acts as an electroplating mask, and a fourth metal layer M4 is electroplated on the fourth seed layer S4 without the fourth patterned photoresist layer P4.

Figure 2S:
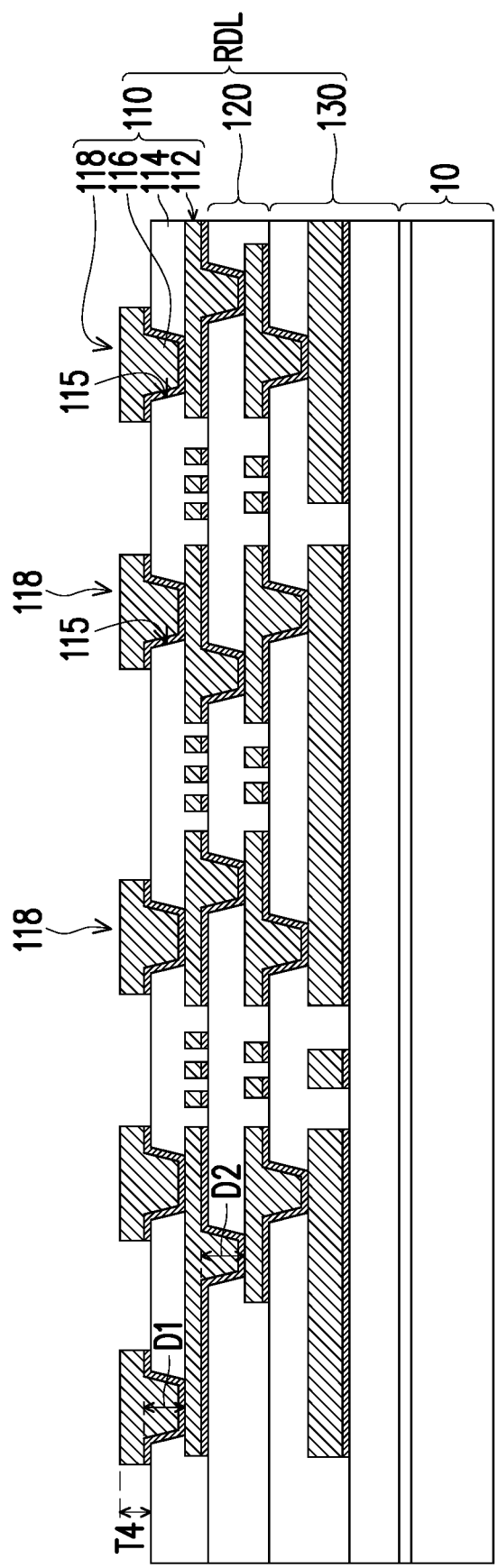

Next, with reference to FIG. 2R and FIG. 2S together, the fourth patterned photoresist layer P4 and the underlying fourth seed layer S4 are removed to expose portions of the first photoimageable dielectric layer 114 and to form a plurality of first conductive through holes 116 located in the openings 115 and a plurality of chip pads 118 located on the first photoimageable dielectric layer 114. Herein, the first conductive through holes 116 and chip pads 118 are formed at the same time, and the first conductive through holes 116 are electrically connected to the first redistribution circuit 112 and the chip pads 118. In addition, a depth D1 of each of the first conductive through holes 116 is less than the depth D2 of each of the second conductive through holes 126, that is, the depth D1 of each of the first conductive through holes 116 is, for example, 5 microns. A size of each of the chip pads 118 is, for example 35 microns, and a thickness T4 of each of the chip pads 118 is, for example, 8 microns. The first redistribution layer 110 is formed on the second redistribution layer 120 so far. The first redistribution layer 110 includes the first redistribution circuit 112, the first photoimageable dielectric layer 114, the first conductive through holes 116 penetrating through the first photoimageable dielectric layer 114, and the chip pads 118.

Figure 2T:
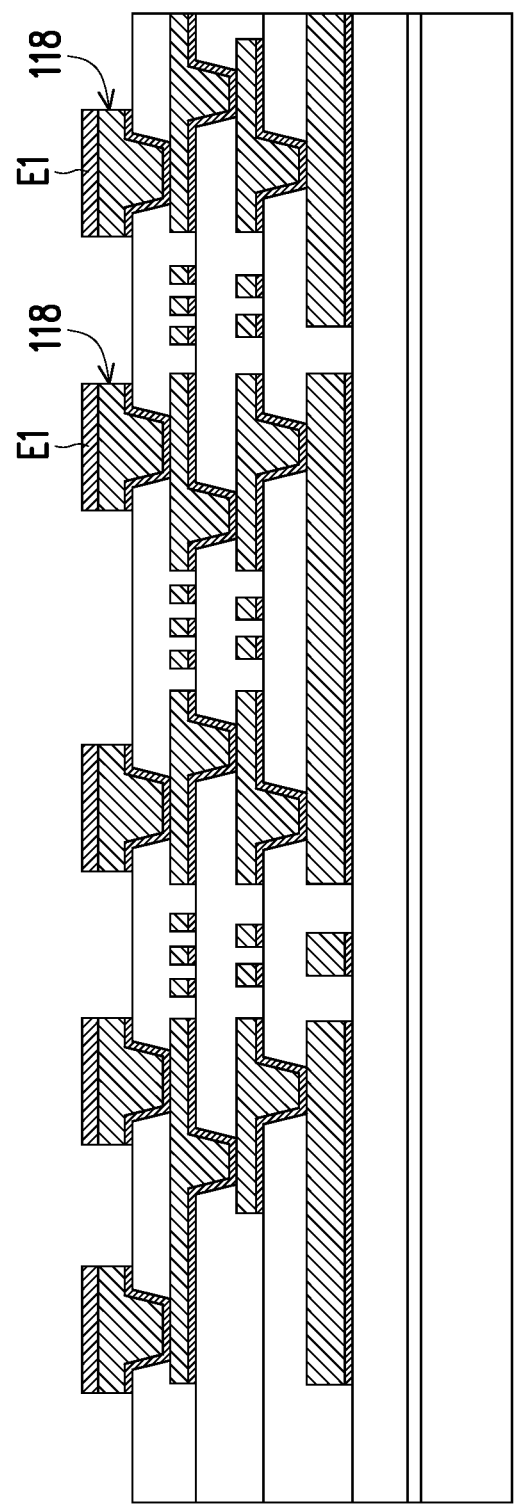

Next, with reference to FIG. 2T, a surface treatment layer E1 is formed on the chip pads 118 to protect the chip pads 118 and to prevent oxidation from occurring. Herein, a material of the surface treatment layer E1 is, but not limited to, electroless nickel electroless palladium immersion gold (ENEPIG), organic solderability preservatives (OSP), or electroless nickel immersion gold (ENIG), for example.

Figure 2U:
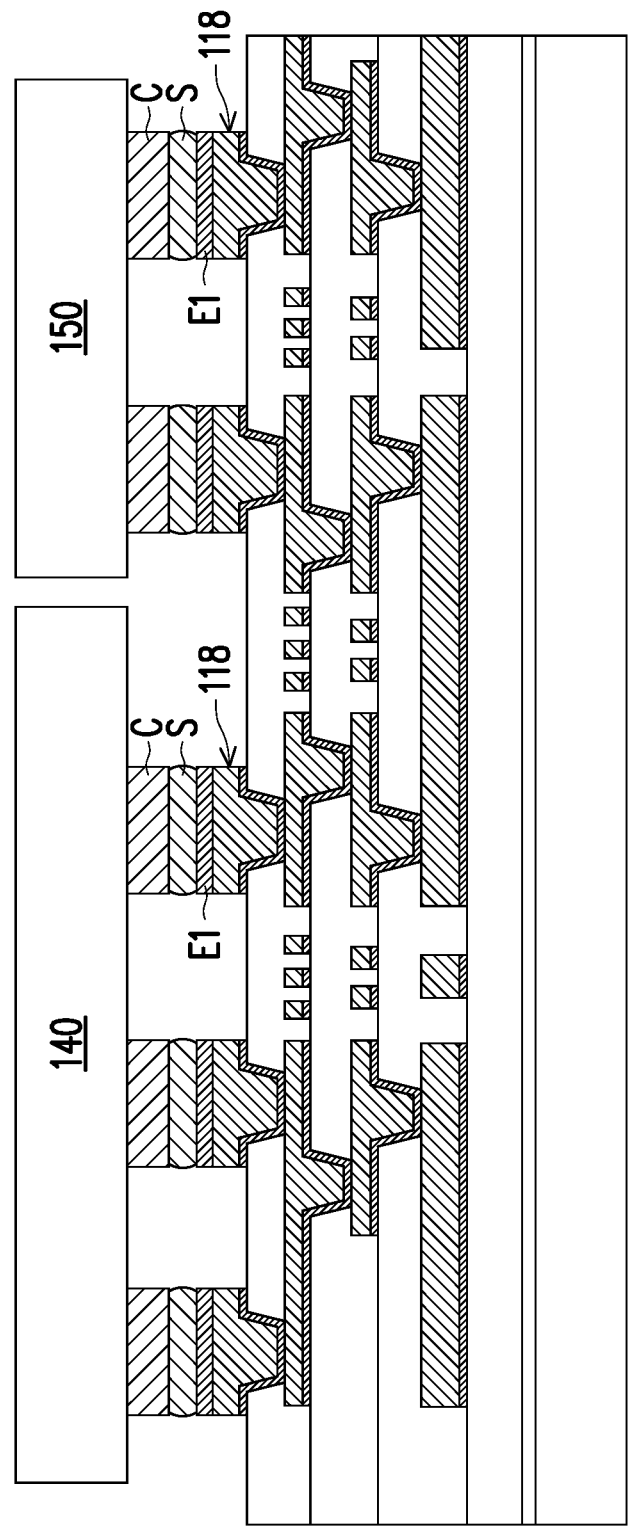

Next, with reference to FIG. 1 and FIG. 2U together, a chip assembly is disposed on the chip pads 118. The chip assembly includes a processor 140 and two memories 150, and a size of the processor 140 is greater than a size of each of the memories 150. Herein, the size of the processor 140 is, for example, 10 mm×10 mm, and the size of each of the memories 150 is, for example, 5 mm×7 mm. Further, the processor 140 and the memories 150 are both application chipsets applied in mobile applications. Moreover, before the chip assembly is disposed on the chip pads 118, a plurality of copper pillars C are formed on the processor 140 and the memories 150 of a wafer first. Next, a plurality of solder materials S are formed on the copper pillars C, and the copper pillars C are located between the solder materials S and the processor 140 and the memories 150. The processor 140 and the memories 150 are then bonded onto the surface treatment layer E1 on the chip pads 118 through the solder materials S on the copper pillars C, such that the processor 140 and the memories 150 are electrically connected to the chip pads 118.

Note that in an embodiment, a wafer is diced into chips after the copper pillar C and the solder materials S are formed, such that the copper pillar C and the solder materials S that are formed on the wafer before singulation may be called as wafer bumping. When the wafer is singulated to form independent chips (e.g., the processor 140 and the memory 150), the chips may be directly assembled on the chip pad 118 through the solder materials S. In another embodiment, a wafer may also be diced into chips before the copper pillar C and the solder materials S are formed, which still belongs to the protection scope of the disclosure.

Figure 2V:
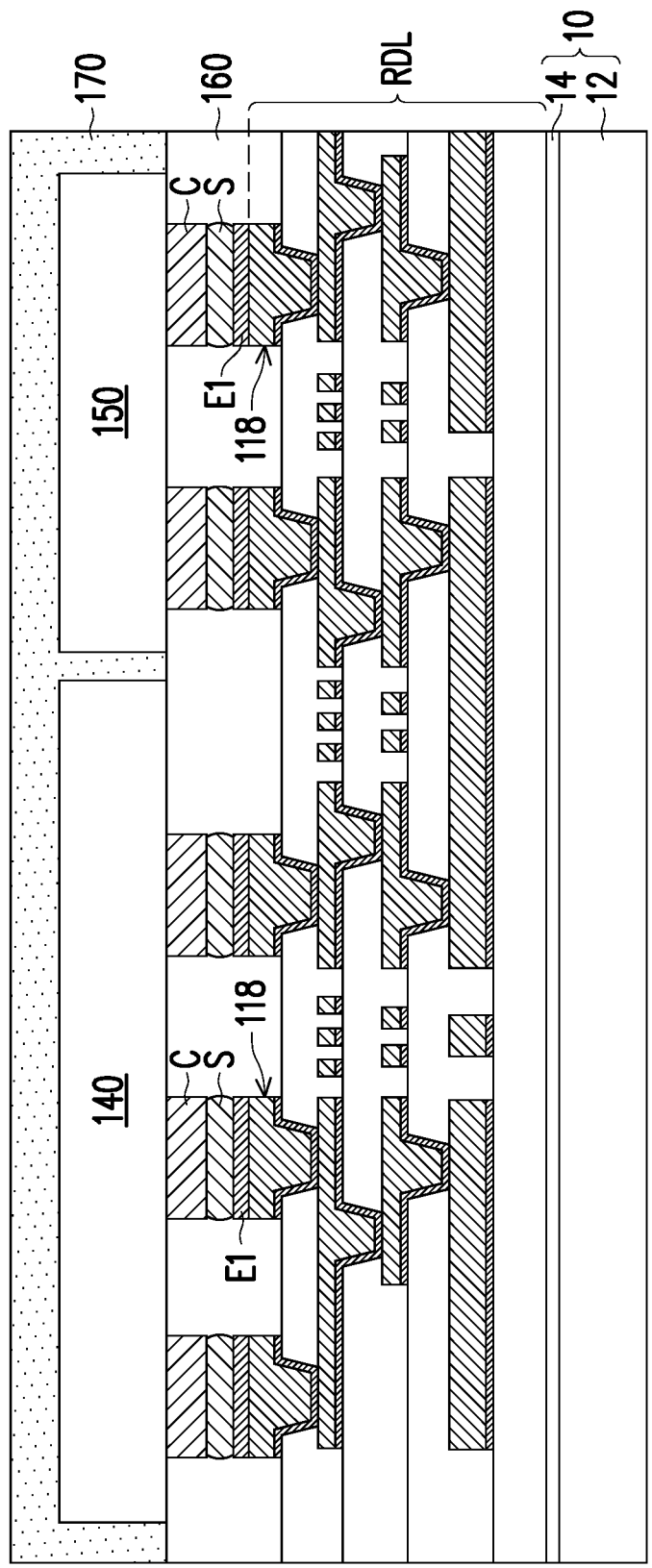

Next, with reference to FIG. 2V, an underfill 160 is formed on the redistribution layer RDL to cover the copper pillars C, the solder materials S, the surface treatment layer E1, and the chip pads 118. A molding compound 170 is then formed to at least cover the processor 140 and the memories 150, and the molding compound 170 covers the processor 140, the memories 150, and the underfill 160.

Figure 2W:
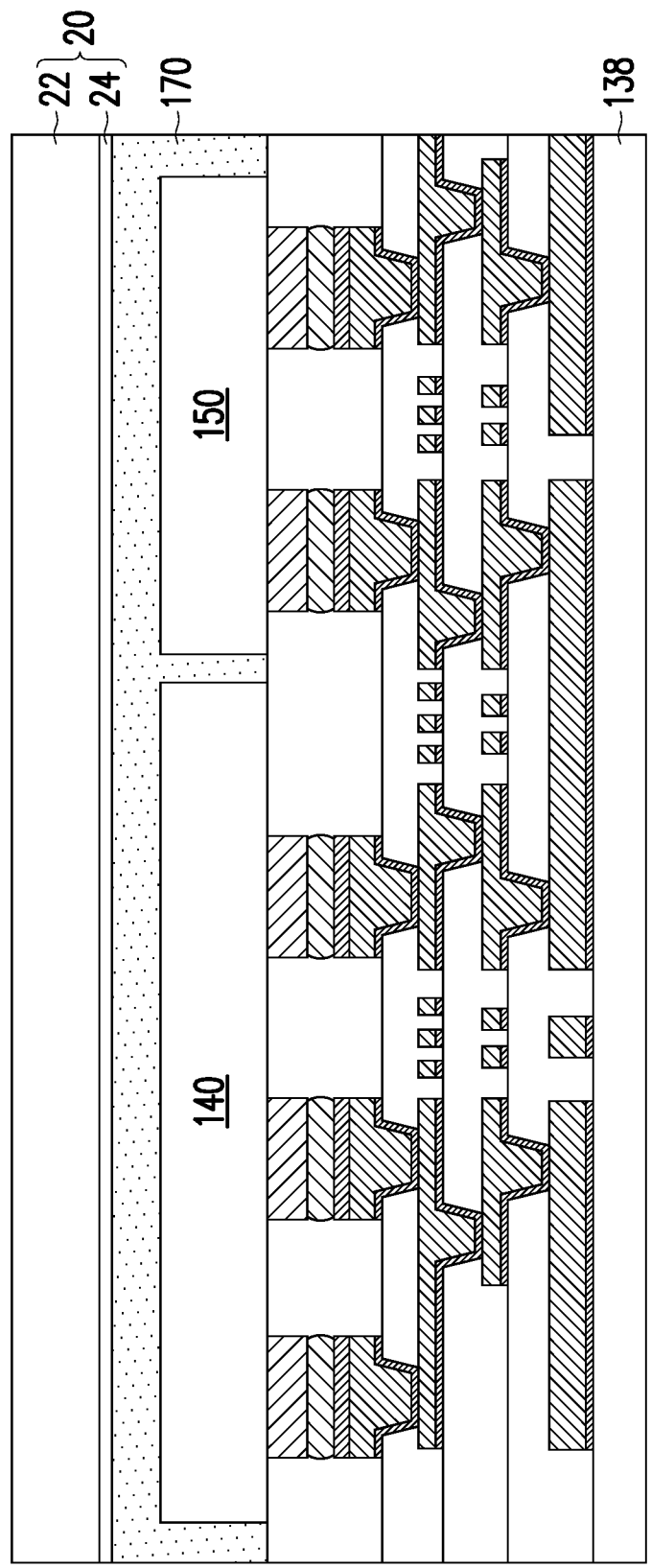

Next, with reference to FIG. 2V and FIG. 2W together, the temporary carrier panel 10 is removed to expose the fourth photoimageable dielectric layer 138. The temporary carrier panel 10 is removed through a laser debonding method, for example, to expose the fourth photoimageable dielectric layer 138. Herein, before the temporary carrier panel 10 is removed, a temporary carrier panel 20 may be selectively disposed on the molding compound 170 to improve overall structural strength. The temporary carrier panel 20 includes a substrate 22 and a release film 24 located on the substrate 22.

Figure 2X:
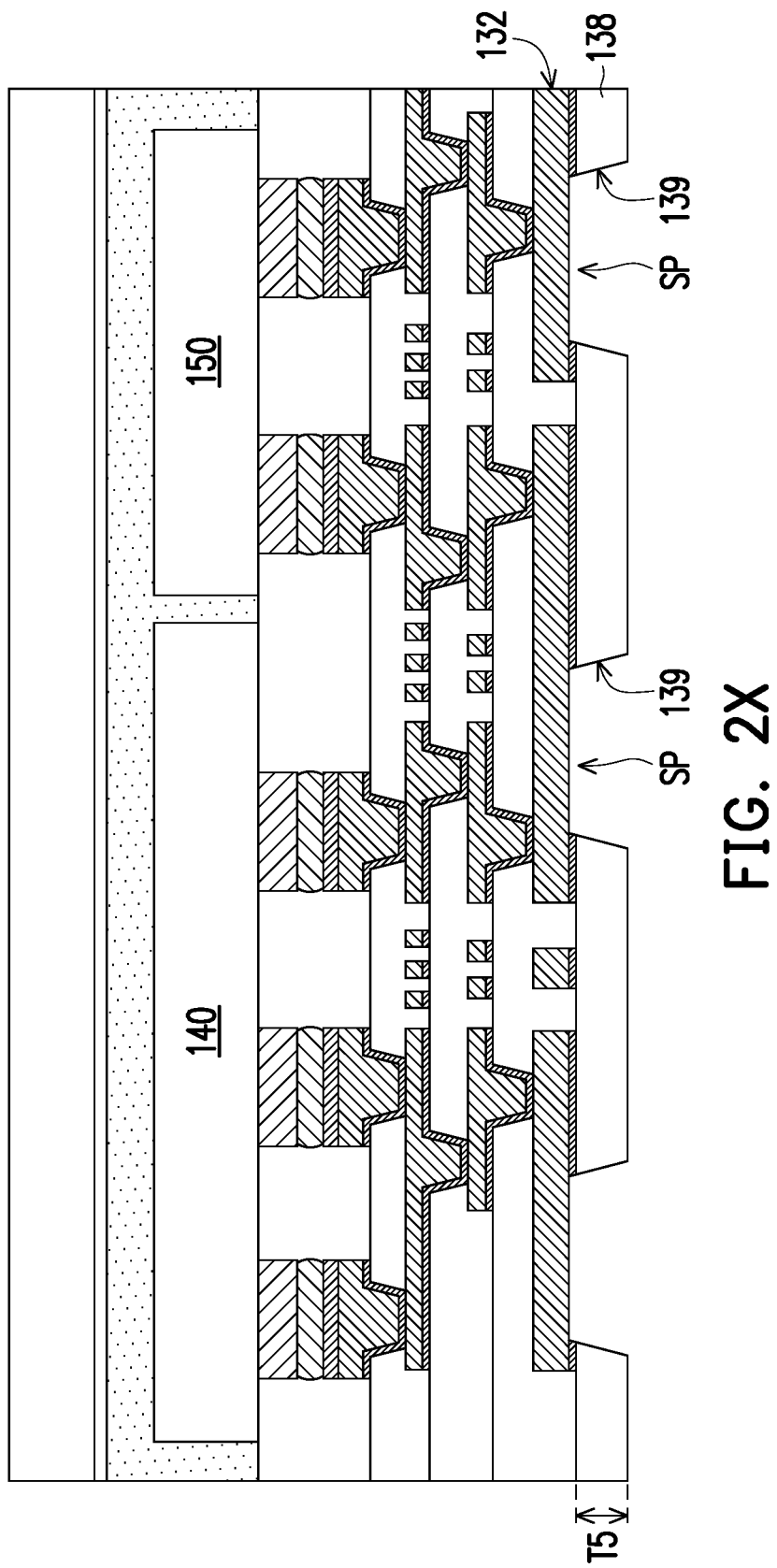

Next, with reference to FIG. 2X, a drilling process is performed on the fourth photoimageable dielectric layer 138 to form openings 139 exposing portions of the third redistribution circuit 132. The first seed layer S1 (referring to FIG. 2A) in the third redistribution layer 132 exposed by the openings 139 is then removed through an etching method to expose portions of the first metal layer M1 (referring to FIG. 2C) to define a plurality of solder ball pads SP. Herein, the fourth photoimageable dielectric layer 138 may be treated as a solder-mask layer, and the drilling process is, but not limited to, carbon dioxide laser drilling, for example. Preferably, a thickness T5 of the fourth photoimageable dielectric layer 138 is, for example, 5 microns, and an aperture of each of the openings 139 is, for example, 245 microns to 250 microns.

Figure 2Y:
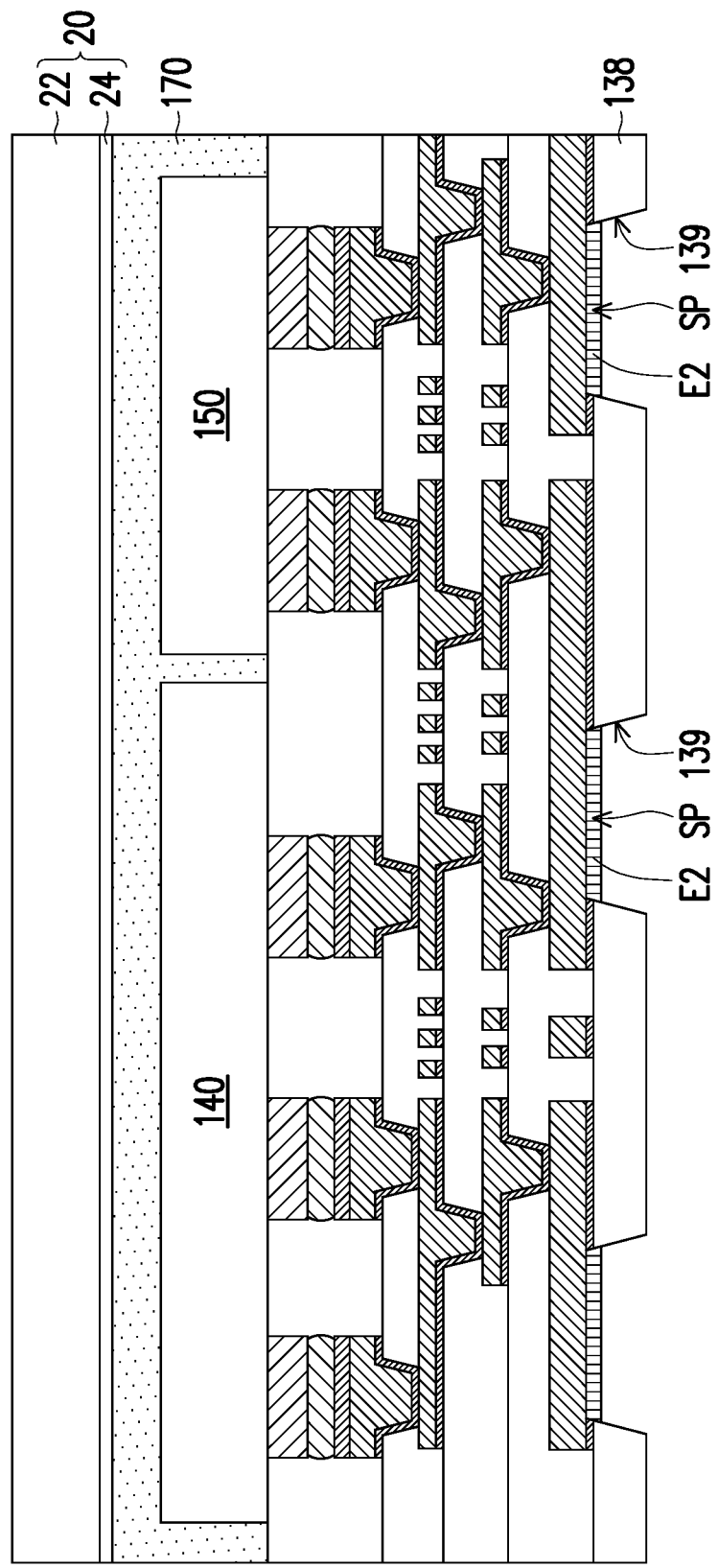
Figure 2Z:
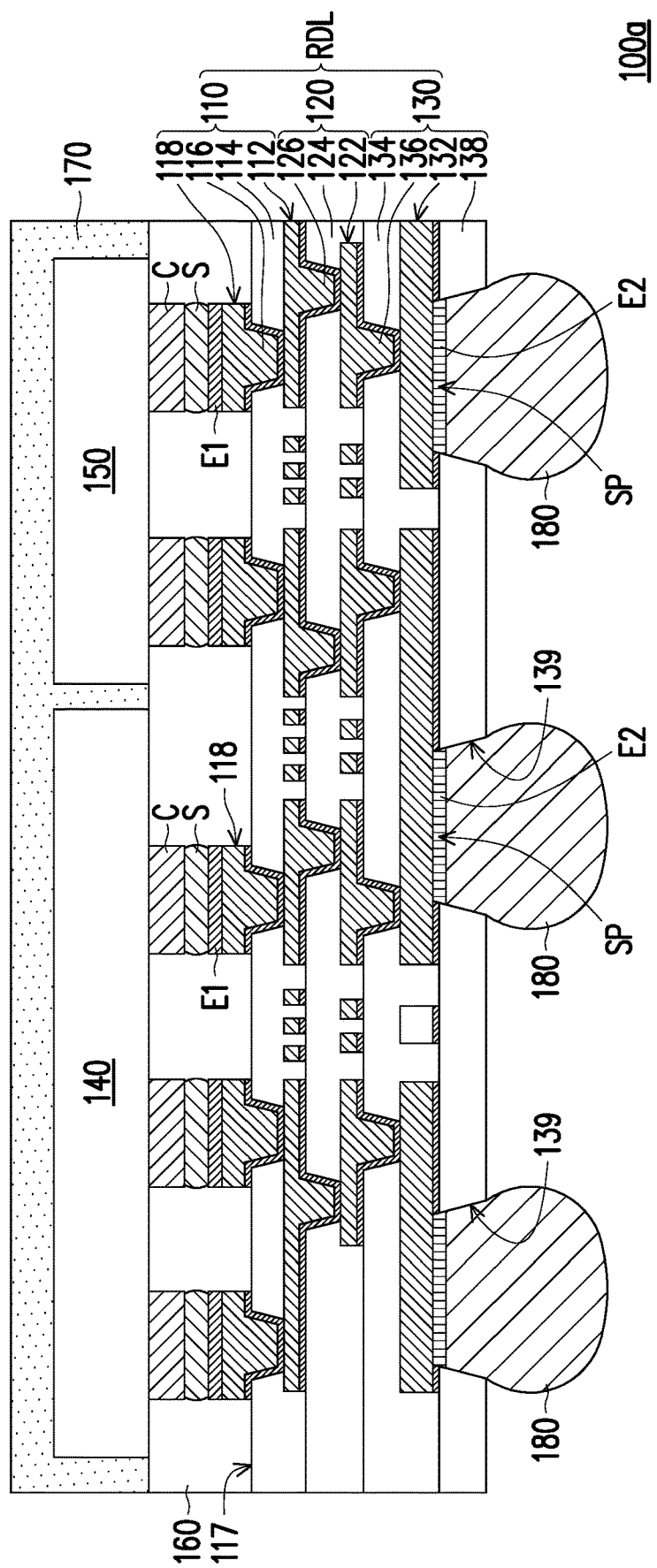

Next, with reference to FIG. 2Y, a surface treatment layer E2 is formed on the solder ball pads SP to protect the solder ball pads SP and to prevent oxidation from occurring. Herein, a material of the surface treatment layer E2 is, but not limited to, ENEPIG, OSP, or ENIG, for example.

Next, with reference to FIG. 2Y and FIG. 2Z together, a plurality of solder balls 180 are formed on the surface treatment layer E2 of the solder ball pads SP to be electrically connected to the solder ball pads SP. Finally, if the temporary carrier panel 20 is disposed, the temporary carrier panel 20 may be removed to expose the molding compound 170, and the release film 24 may be peeled off, for example, to expose the molding compound 170 to remove the temporary carrier panel 20. Manufacturing of a package structure 100a is completed so far.

Structurally, with reference to FIG. 2Z again, in this embodiment, the package structure 100a includes the redistribution layer RDL, the chip assembly, the solder balls 180, and the molding compound 170. The redistribution layer RDL includes a plurality of redistribution circuits, a plurality of photoimageable dielectric layers, a plurality of conductive through holes, and the plurality of chip pads 118. The redistribution circuits and the photoimageable dielectric layers are disposed in an alternating manner, and the conductive through holes penetrate through the photoimageable dielectric layers and are electrically connected to the redistribution circuits. Further, the redistribution layer RDL includes the first redistribution layer 110, the second redistribution layer 120, and the third redistribution layer 130. The redistribution circuit includes the first redistribution circuit 112, the second redistribution circuit 122, and the third redistribution circuit 132. The photoimageable dielectric layers include the first photoimageable dielectric layer 114, the second photoimageable dielectric layer 124, the third photoimageable dielectric layer 134, and the fourth photoimageable dielectric layer 138. The conductive through holes include the first conductive through holes 116, the second conductive through holes 126, and the third conductive through holes 136. The first redistribution layer includes the chip pads 118, the first redistribution circuit 112, the first photoimageable dielectric layer 114, and the first conductive through holes 116 penetrating through the first photoimageable dielectric layer 114. The first photoimageable dielectric layer 114 has an upper surface 117, the chip pads 118 are electrically connected to the first redistribution circuit 112 through the first conductive through holes 116. The second redistribution layer 120 includes the second redistribution circuit 122, the second photoimageable dielectric layer 124, and the second conductive through holes 126 penetrating through the second photoimageable dielectric layer 124. The second conductive through holes 126 are electrically connected to the first redistribution circuit 112 and the second redistribution circuit 122. The third redistribution layer 130 includes the third redistribution circuit 132, the third photoimageable dielectric layer 134, the fourth photoimageable dielectric layer 138, and the third conductive through holes 136 penetrating through the third photoimageable dielectric layer 134. The third conductive through holes 136 are electrically connected to the second redistribution circuit 122 and the third redistribution circuit 132. The fourth photoimageable dielectric layer 138 covers the third photoimageable dielectric layer 134 and the third redistribution circuit 132 and has the openings 139. The openings 139 expose portions of the third redistribution circuit 132 to define the solder ball pads SP. Herein, in the redistribution layer RDL, the photoimageable dielectric layers located on opposite two outermost sides are the first photoimageable dielectric layer 114 and the fourth photoimageable dielectric layer 138. The first photoimageable dielectric layer 114 has the upper surface 117, and the fourth photoimageable dielectric layer 138 has the openings 139.

In particular, in this embodiment, the line widths and the line spacings of the redistribution circuits decrease in a direction from the solder ball pads SP towards the chip pads 118. That is, the line width and the line spacing of the third redistribution circuit 132 are greater than the line width and the line spacing of the second redistribution circuit 122, and the line width and the line spacing of the second redistribution circuit 122 are greater than the line width and the line spacing of the first redistribution circuit 112. Preferably, the line width and the line spacing of the first redistribution circuit 112 are both, for example, 2 microns, the line width and the line spacing of the second redistribution circuit 122 are both, for example, 5 microns, and the line width and the line spacing of the third redistribution circuit 132 are both, for example, 10 microns. Further, the thickness T1 of the first redistribution circuit 112 is equal to the thickness T2 of the second redistribution circuit 122, and the thickness T2 of the second redistribution circuit 122 is less than the thickness T3 of the third redistribution circuit 132. Besides, the depth D2 of each of the second conductive through holes 126 is equal to the depth D3 of each of the third conductive through holes 136, and the depth D1 of each of the first conductive through holes 116 is less than the depth D2 of each of the second conductive through holes 126.

With reference to FIG. 2Z again, the chip assembly is disposed on the chip pads 118 and is electrically connected to the chip pads 118. The chip assembly includes the processor 140 and two memories 150, and the size of the processor 140 is greater than the size of each of the memories 150. In this embodiment, the package structure 100a further includes the surface treatment layer E1 disposed on the chip pads 118, so that oxidation is prevented from occurring in the chip pads 118. Further, the package structure 100a provided by the present embodiment further includes the copper pillars C and the solder materials S. The copper pillars C are disposed on the chip assembly and are located between the chip assembly and the chip pads 118, and the solder materials S are disposed on the copper pillars C and are located between the copper pillars C and the chip pads 118. The processor 140 and the memories 150 are electrically connected to the chip pads 118 through the copper pillars C, the solder materials S, and the surface treatment layer E1. In this embodiment, the package structure 100a may further include the underfill 160 to cover the copper pillars C, the solder materials S, the surface treatment layer E1, and the chip pads 118, and in this way, the copper pillars C, the solder materials S, the surface treatment layer E1, and the chip pads 118 are protected. The molding compound 170 covers the processor 140, the memories 150, and the underfill 160. The underfill is disposed between the molding compound 170 and the redistribution layer RDL, and a periphery of the underfill 160 is aligned with a periphery of the molding compound 170. Herein, a periphery of the molding compound 170 is aligned with a periphery of the first redistribution layer 110, a periphery of the second redistribution layer 120, and a periphery of the third redistribution layer 130. In addition, the solder balls 180 are disposed on the solder ball pads SP and are electrically connected to the solder ball pads SP.

In short, in this embodiment, the redistribution layer RDL is formed on the temporary carrier panel 10 first, and such temporary carrier panel 10 is removed after the chip assembly is disposed on the chip pads 118. That is, the third redistribution circuit 132 which subsequently forms the solder ball pads SP is manufactured first, and the chip pads 118 are then manufactured and formed. Therefore, in this embodiment, transferring is not required to be performed, so that the package structure 100a may exhibit good structural reliability. Further, since the redistribution layer RDL is formed on the temporary carrier panel 10, the redistribution layer RDL may be solid and flat. In this way, the solder materials S between the chip assembly and the redistribution layer RDL may re-flow, and high throughput is thereby provided. In addition, compared to the package-on-package (POP) provided by the related art, the package structure 100a formed by the chip assembly and the redistribution layer RDL provided by the present embodiment may require less manufacturing costs, exhibit smaller package size, and provide better performance as the overall signal transmission route is reduced since stacking is not required (that is, the processor 140 and the memories 150 may be placed on the same substrate).

It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiments for the omitted contents, which will not be repeated hereinafter.

Figure 3:
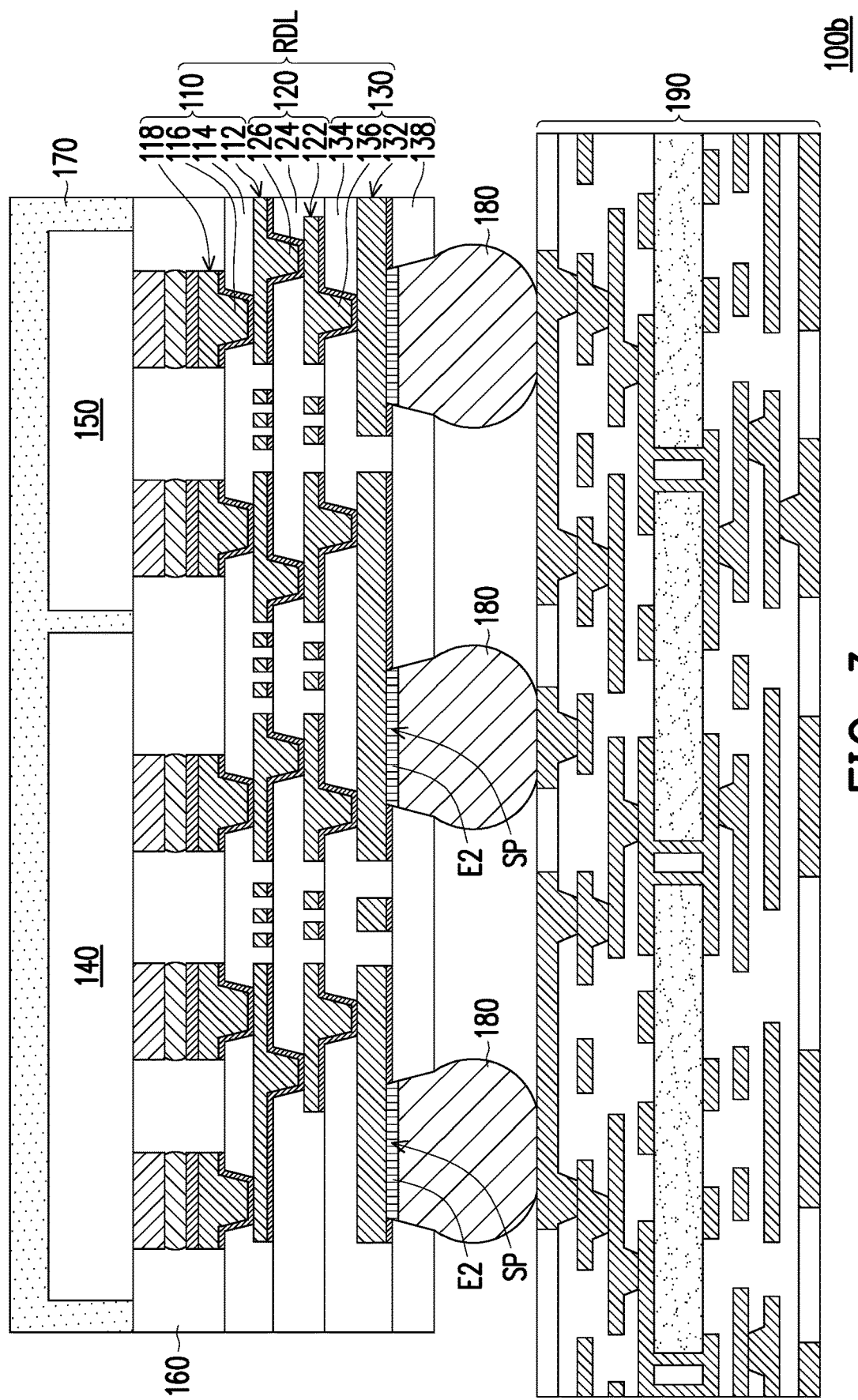
FIG. 3 is a cross-sectional schematic view of a package structure according to another embodiment of the disclosure.

FIG. 3 is a cross-sectional schematic view of a package structure according to another embodiment of the disclosure. With reference to FIG. 2Z and FIG. 3 together, a package structure 100b provided by the present embodiment is similar to the package structure 100a described above, and a difference therebetween is that in this embodiment, a circuit board 190 is further provided below the redistribution layer RDL. The processor 140 and the memories 150 may be electrically connected to the circuit board 190 through the solder balls 180.

In view of the foregoing, in the disclosure, the redistribution layer is formed on the temporary carrier panel first, and such temporary carrier panel is removed after the chip assembly is disposed on the chip pads. That is, the third redistribution circuit which subsequently forms the solder ball pads is manufactured first, and the chip pads are then manufactured and formed. Therefore, in the disclosure, transferring is not required to be performed, so that the package structure may exhibit good structural reliability. In addition, since the redistribution layer is formed on the temporary carrier panel, the redistribution layer may be solid and flat. In this way, the solder materials between the chip assembly and the redistribution layer may re-flow, and high throughput is thereby provided.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A package structure, comprising:
   a redistribution layer, comprising a plurality of redistribution circuits, a plurality of photoimageable dielectric layers, a plurality of conductive through holes, and a plurality of chip pads, wherein the redistribution circuits and the photoimageable dielectric layers are disposed in an alternating manner, and the conductive through holes penetrate through the photoimageable dielectric layers and are electrically connected to the redistribution circuits, wherein one of the photoimageable dielectric layers located on opposite two outermost sides has an upper surface, the chip pads are located on the upper surface and are electrically connected to the redistribution circuits through the conductive through holes, the other one of the photoimageable dielectric layers located on the opposite two outermost sides has a plurality of openings, the openings expose portions of the redistribution circuits to define a plurality of solder ball pads, and line widths and line spacings of the redistribution circuits decrease in a direction from the solder ball pads towards the chip pads;
   a chip assembly, disposed on the chip pads, electrically connected to the chip pads, wherein the chip assembly comprises at least two chips with different sizes;
   a plurality of solder balls, disposed on the solder ball pads, electrically connected to the solder ball pads; and
   a molding compound, at least covering the chip assembly, wherein the redistribution layer comprises a first redistribution layer, a second redistribution layer, and a third redistribution layer, the redistribution circuits comprises a first redistribution circuit, a second redistribution circuit, and a third redistribution circuit, the photoimageable dielectric layers comprise a first photoimageable dielectric layer, a second photoimageable dielectric layer, a third photoimageable dielectric layer, and a fourth photoimageable dielectric layer, and the conductive through holes comprise a plurality of first conductive through holes, a plurality of second conductive through holes, and a plurality of third conductive through holes,
   wherein the first redistribution layer comprises the chip pads, the first redistribution circuit, the first photoimageable dielectric layer, and the first conductive through holes penetrating through the first photoimageable dielectric layer, the first photoimageable dielectric layer has the upper surface, and the chip pads are electrically connected to the first redistribution circuit through the first conductive through holes,
   wherein the second redistribution layer comprises the second redistribution circuit, the second photoimageable dielectric layer, and the second conductive through holes penetrating through the second photoimageable dielectric layer, and the second conductive through holes are electrically connected to the first redistribution circuit and the second redistribution circuit,
   wherein the third redistribution layer comprises the third redistribution circuit, the third photoimageable dielectric layer, the fourth photoimageable dielectric layer, and the third conductive through holes penetrating through the third photoimageable dielectric layer, the third conductive through holes are electrically connected to the second redistribution circuit and the third redistribution circuit, the fourth photoimageable dielectric layer covers the third photoimageable dielectric layer and the third redistribution circuit and has the openings, and the openings expose portions of the third redistribution circuit to define the solder ball pads, wherein a line width and a line spacing of the third redistribution circuit are greater than a line width and a line spacing of the second redistribution circuit, and the line width and the line spacing of the second redistribution circuit are greater than a line width and a line spacing of the first redistribution circuit, wherein a depth of each of the second conductive through holes is equal to a depth of each of the third conductive through holes, and a depth of each of the first conductive through holes is less than the depth of each of the second conductive through holes.

2. The package structure according to claim 1, wherein the line width and the line spacing of the first redistribution circuit are both 2 microns, the line width and the line spacing of the second redistribution circuit are both 5 microns, and the line width and the line spacing of the third redistribution circuit are both 10 microns.

3. The package structure according to claim 1, wherein a thickness of the first redistribution circuit is equal to a thickness of the second redistribution circuit, and the thickness of the second redistribution circuit is less than a thickness of the third redistribution circuit.

4. The package structure according to claim 1, wherein a periphery of the molding compound is aligned with a periphery of the first redistribution layer, a periphery of the second redistribution layer, and a periphery of the third redistribution layer.

5. The package structure according to claim 1, further comprising:
    a plurality of copper pillars, disposed on the chip assembly, located between the chip assembly and the chip pads; and
    a plurality of solder materials, disposed on the copper pillars, located between the copper pillars and the chip pads.

6. The package structure according to claim 5, further comprising:
    an underfill, disposed between the molding compound and the redistribution layer, wherein the underfill covers the copper pillars, the solder materials, and the chip pads, and a periphery of the underfill is aligned with a periphery of the molding compound.

7. The package structure according to claim 1, wherein the chip assembly comprises a processor and two memories, and a size of the processor is greater than a size of each of the memories.

8. The package structure according to claim 1, further comprising:
    a circuit board, disposed below the redistribution layer, wherein the chip assembly is electrically connected to the circuit board through the solder balls.

\* \* \* \* \*